(12) United States Patent
Patlolla et al.

(10) Patent No.: US 10,916,431 B2
(45) Date of Patent: Feb. 9, 2021

(54) ROBUST GATE CAP FOR PROTECTING A GATE FROM DOWNSTREAM METALLIZATION ETCH OPERATIONS

(71) Applicant: International Business Machines Corporation, Armonk, NY (US)

(72) Inventors: Raghuveer Reddy Patlolla, Guilderland, NY (US); Hari Prasad Amanapu, Guilderland, NY (US); Vimal Kamineni, Mechanicville, NY (US); Sugirtha Krishnamurthy, Manassas, VA (US); Viraj Yashawant Sardesai, Clifton Park, NY (US); Cornelius Brown Peethala, Slingerlands, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/385,668

(22) Filed: Apr. 16, 2019

(65) Prior Publication Data
US 2020/0335345 A1    Oct. 22, 2020

(51) Int. Cl.
*H01L 29/76* (2006.01)
*H01L 29/94* (2006.01)
(Continued)

(52) U.S. Cl.
CPC .. *H01L 21/28052* (2013.01); *H01L 21/76853* (2013.01); *H01L 29/4941* (2013.01)

(58) Field of Classification Search
CPC ............ H01L 29/517; H01L 21/28518; H01L 21/28052; H01L 29/4933; H01L 29/4975;
(Continued)

(56) References Cited

U.S. PATENT DOCUMENTS 5,633,200 A    5/1997  Hu
5,659,194 A    8/1997  Iwamatsu et al.
(Continued)

OTHER PUBLICATIONS

Liu et al., "Nanoscale Wet Etching of Physical-Vapor-Deposited Titanium Nitride and Its Application to Sub-30-nm-Gate-Length Fin-Type Double-Gate Metal-Oxide-Semiconductor Field-Effect Transistor Fabrication," Japanese Journal of Applied Physics 49.6S, 2010, 06GH18, 6 pages.

*Primary Examiner* — Theresa T Doan
(74) *Attorney, Agent, or Firm* — Cantor Colburn LLP; Joseph Petrokaitis

(57) ABSTRACT

Embodiments of the invention describe a method of forming an integrated circuit. The method includes forming an active semiconductor device region over a substrate. A first contact structure is formed over the active semiconductor device region, wherein the first contact structure includes a first contact liner material and a first contact body material. A conductive gate structure is formed over the active semiconductor device region, and a first gate cap material is formed on the conductive gate structure. The first contact liner material includes a first etch selectivity responsive to a first etch composition, the first contact body material includes a second etch selectivity responsive to the first etch composition, and the first gate cap material includes a third etch selectivity responsive to the first etch composition. The first etch selectivity is greater than each of the second and third etch selectivies.

11 Claims, 4 Drawing Sheets

(51) Int. Cl.
*H01L 31/062* (2012.01)
*H01L 21/28* (2006.01)
*H01L 21/768* (2006.01)
*H01L 29/49* (2006.01)

(58) Field of Classification Search
CPC ......... H01L 21/76843; H01L 21/76855; H01L 29/4925; H01L 21/76826; H01L 21/76849; H01L 21/76852; H01L 21/823871; H01L 29/4916
USPC ....................................................... 257/388
See application file for complete search history.

(56) References Cited

U.S. PATENT DOCUMENTS

| | | | |
|---|---|---|---|
| 5,726,096 | A | 3/1998 | Jung |
| 6,369,429 | B1 | 4/2002 | Pramanick et al. |
| 6,432,779 | B1 | 8/2002 | Hobbs et al. |
| 7,491,588 | B2 | 2/2009 | Campbell et al. |
| 8,034,701 | B2 | 10/2011 | Lee et al. |
| 9,607,856 | B2 | 3/2017 | Wang et al. |
| 2002/0068442 | A1* | 6/2002 | Shimpuku ......... H01L 21/76811 438/638 |
| 2005/0156208 | A1 | 7/2005 | Lin et al. |
| 2013/0171793 | A1* | 7/2013 | Heo ...................... H01L 29/665 438/294 |
| 2017/0110363 | A1* | 4/2017 | Aoyama ................ C11D 3/364 |
| 2017/0260449 | A1 | 9/2017 | Barnes et al. |
| 2019/0296012 | A1* | 9/2019 | Iwata ................ H01L 21/76831 |

\* cited by examiner

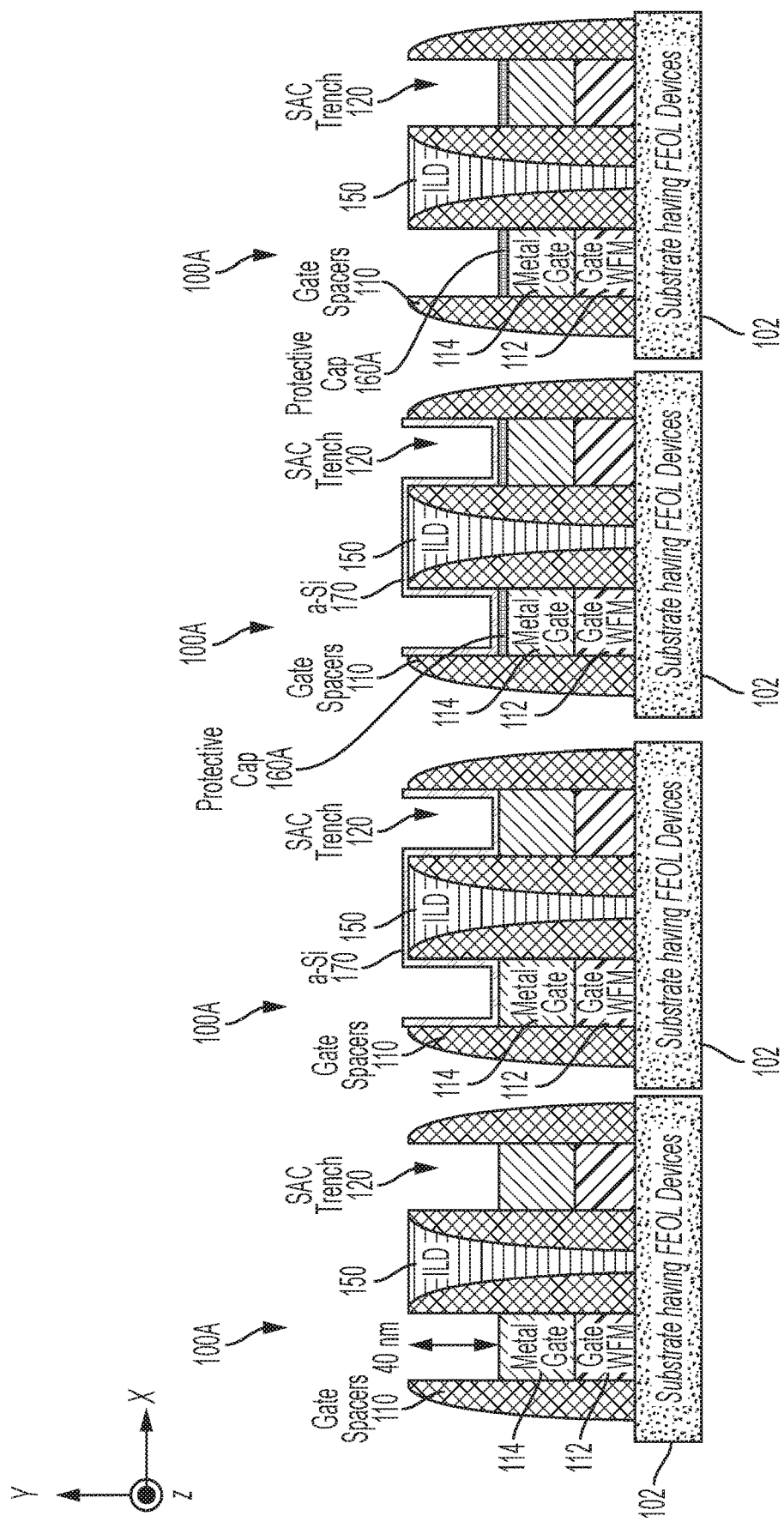

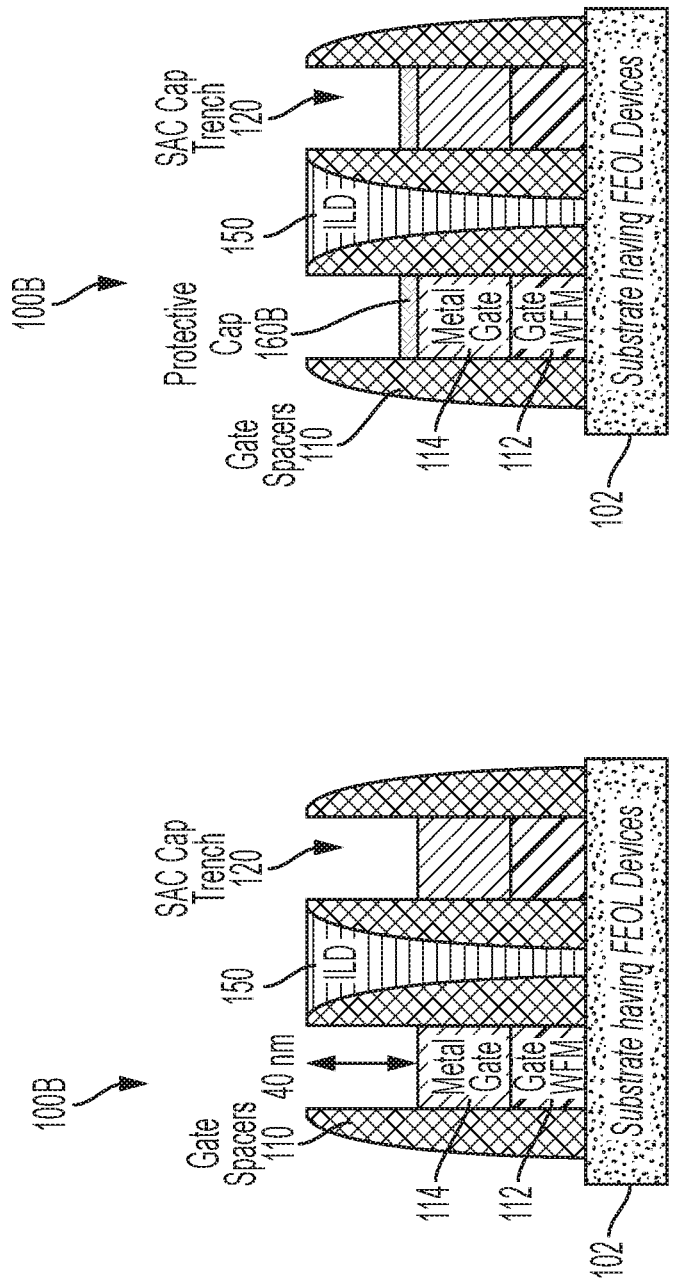

ROBUST GATE CAP FOR PROTECTING A GATE FROM DOWNSTREAM METALLIZATION ETCH OPERATIONS

BACKGROUND

The present invention relates in general to fabrication methodologies and resulting structures for semiconductor devices. More specifically, the present invention is related to fabrication methods and resulting structures for forming a robust protective gate cap configured and arranged to protect the gate from downstream metallization operations, including, for example, the wet etch removal of excess contact liner material (e.g., TiN) selective to the contact (e.g., cobalt (Co)).

Integrated circuits (ICs) are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections are formed above these logical and functional layers during the BEOL stage to complete the IC.

SUMMARY

Embodiments of the invention are directed to a method of forming an integrated circuit. The method includes forming an active semiconductor device region over a substrate. A first contact structure is formed over the active semiconductor device region, wherein the first contact structure includes a first contact liner material and a first contact body material. A conductive gate structure is formed over the active semiconductor device region, and a first gate cap is formed on the conductive gate structure, wherein the first gate cap includes a first gate cap material. The first contact liner material includes a first etch selectivity responsive to a first etch composition, the first contact body material includes a second etch selectivity responsive to the first etch composition, and the first gate cap material includes a third etch selectivity responsive to the first etch composition. The first etch selectivity is greater than each of the second etch selectivity and the third etch selectivity.

Embodiments of the invention are directed to an integrated circuit structure having an active semiconductor device region formed over a substrate. A first contact structure is formed over the active semiconductor device region, wherein the first contact structure includes a first contact liner material and a first contact body material. A conductive gate structure is formed over the active semiconductor device region, and a first gate cap is formed on the conductive gate structure, wherein the first gate cap includes a first gate cap material. The first contact liner material includes a first etch selectivity responsive to a first etch composition, the first contact body material includes a second etch selectivity responsive to the first etch composition, and the first gate cap material includes a third etch selectivity responsive to the first etch composition. The first etch selectivity is greater than each of the second etch selectivity and the third etch selectivity.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIGS. 1-4 depict the results of fabrication operations for forming a protective gate cap in accordance with aspects of the invention, in which:

FIG. 1 depicts a cross-sectional view of a representative section of an IC after fabrication operations according to embodiments of the invention;

FIG. 2 depicts a cross-sectional view of the representative section of an IC after additional fabrication operations according to embodiments of the invention;

FIG. 3 depicts a cross-sectional view of a representative section of the IC after additional fabrication operations according to embodiments of the invention; and FIG. 4 depicts a cross-sectional view of a representative section of the IC after additional fabrication operations according to embodiments of the invention;

FIGS. 5-6 depict the results of fabrication operations for forming a protective gate cap in accordance with aspects of the invention, in which:

FIG. 5 depicts a cross-sectional view of a representative section of an IC after fabrication operations according to embodiments of the invention; and FIG. 6 depicts a cross-sectional view of a representative section of the IC after additional fabrication operations according to embodiments of the invention;

FIGS. 7-8 depict the results of fabrication operations for forming a protective gate cap in accordance with aspects of the invention, in which:

FIG. 7 depicts a cross-sectional view of a representative section of an IC after fabrication operations according to embodiments of the invention; and FIG. 8 depicts a cross-sectional view of a representative section of the IC after additional fabrication operations according to embodiments of the invention.

Figure 8:
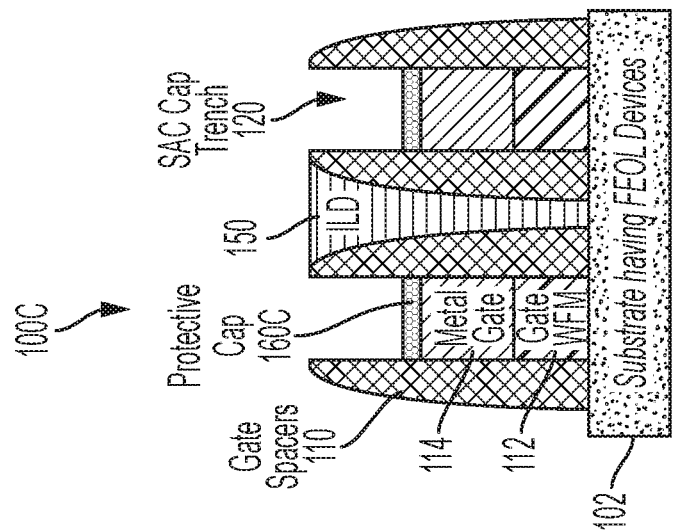

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for exemplary types of interconnect stacks, implementation of the teachings recited herein are not limited to a particular type of interconnect stack or IC architecture. Rather, embodiments of the present invention are capable of being implemented in conjunction with any other type of interconnect stack or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, semiconductor devices are used in a variety of electronic and electro-optical applications. ICs are typically formed from various circuit configurations of semiconductor devices (e.g., transistors, capacitors, resistors, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

In contemporary semiconductor fabrication processes, a large number of semiconductor devices and conductive interconnect layers are fabricated. More specifically, during the first portion of chip-making (i.e., the FEOL stage), the individual components (transistors, capacitors, etc.) are fabricated on the wafer. The MOL stage follows the FEOL stage and typically includes process flows for forming the contacts and other structures that communicatively couple to active regions (e.g., gate, source, and drain) of the device element. For example, the silicidation of source/drain regions, as well as the deposition of metal contacts, can occur during the MOL stage to connect the individual components fabricated during the FEOL stage. In the BEOL stage, these components are connected to each other to distribute signals, as well as power and ground. The conductive interconnect layers serve as a network of pathways that transport signals throughout an IC, thereby connecting circuit components of the IC into a functioning whole and to the outside world. Because there typically isn't enough room on the chip surface to create all of the necessary connections in a single layer, chip manufacturers build vertical levels of interconnects. While simpler ICs can have just a few metal layers, complex ICs can have ten or more layers of wiring.

Interconnect structures close to the transistors need to be small because they attach/join to the components that are themselves very small and often closely packed together. These lower-level lines, which can be referred to as local interconnects, are usually thin and short in length. Global interconnects are higher up in the structure and travel between different blocks of the circuit. Thus, global interconnects are typically thick, long, and widely separated. Connections between interconnect levels, called vias, allow signals and power to be transmitted from one layer to the next.

Interconnect structures are often formed in a stack. For example, a transistor can have a gate contact (also referred to as a CB contact) and S/D contacts (also referred to as CA contacts). The S/D contacts can extend through an interlayer dielectric (ILD) region of the IC from a metal wire or via in the BEOL metal level to metal plugs (also referred to as trench silicide (TS) contacts), which are on the S/D regions of the transistor. A conventional interconnect stack fabrication process starts with the deposition of an ILD insulating material (e.g., $SiO_2$) over the transistor followed by the creation of trenches in the ILD insulating material. The trenches are positioned over the portion of the transistor (source, gate, drain) to which electrical coupling will be made. A liner/barrier material is deposited within the trench, and, for S/D regions, the remaining trench volume is filled with material that will form the metal plugs (or TS contacts) using, for example, a chemical/electroplating process. The excess metal is removed to form a flat surface for subsequent processing. A cap layer can be deposited over the exposed top surface of the metal plug. This process is repeated until all portions of the interconnect structure stack have been formed.

It is desirable to form the gate from tungsten (W), the contact liner from TiN, and the S/D contacts from cobalt (Co). However, there are etch selectivity problems with this W/TiN/Co combination of gate, contact liner, and S/D contact materials. More specifically, downstream interconnect structure fabrication operations require the removal of leftover TiN contact material, which can be performed by etching the leftover portions of the TiN contact liner selective to the Co S/D contact. However, a known wet etch composition that can etch TiN selective to Co (referred to herein as "the KWE" composition) does not have etch selectivity with respect to W. In other words, the KWE composition that can etch TiN selective to Co will also attack/etch W. It is known to form a self-aligned cap (SAC) structure over the gate for gate protection during downstream fabrication operations. However, in some regions of the wafer, known SAC structures that are supposed to protect the gates can fail, thereby exposing portions of the underlying W gate. Such failures can be attributed to a variety of factors, including, for example, the relatively thin SAC structure, as well as the SAC material (e.g., SiN). Additionally, some SAC structures can be formed from material that allows the KWE composition, which can etch TiN selective to Co, to diffuse through the SAC structure and attack the underlying gate.

Turning now to an overview of aspects of the invention, embodiments of the invention address the problem of thin, weakened, and diffusion-susceptible SAC structures by forming a robust proactive cap region over the gate prior to depositing the SAC structure. In embodiments of the invention, the protective cap region can be formed from a cap region material that will not have etch selectivity to the KWE composition, which etches the contact liner (e.g., TiN) selective to the S/D contact (e.g., Co) and the gate contact (e.g., Co). In embodiments of the invention, a characteristic of the gate material that makes it susceptible to the above-described TiN wet etch composition (i.e., the KWE composition) is the gate material's corrosion rate. Accordingly, in embodiments of the invention, the protective cap region can be formed from a cap region material having a wet etch rate in response to the KWE composition that is <about 5 A/min (angstroms/minute). In embodiments of the invention, the protective cap region can be formed from a cap region material having a wet etch rate in response to the KWE composition that is <about 1% of the wet etch rate of the gate materials in response to the KWE composition. In embodiments of the invention, the protective cap region can be formed by converting a selected region of the gate to the protective cap material. In embodiments of the invention, the protective cap region can be formed by converting a selected region of the gate to a silicide of the gate material. In some embodiments of the invention, the protective cap region can be formed by converting a selected region of the gate to a nitride of the gate material. In embodiments of the invention, the protective cap region can be formed by implanting carbon to a selected region of the gate material. In each of the above-described protective cap region fabrication processes, the resulting protective cap region material is the gate material having impurities (e.g., silicide, nitride, carbon, and the like) that reduce the gate material's etch rate in response to the KWE composition in that region (i.e., the protective cap region), thereby rendering the protective gate cap region robust in that the protective gate cap region will not have etch selectivity to the KWE composition that etches the contact liner (e.g., TiN) selective to the S/D contact (e.g., Co) and the gate contact (e.g., Co).

Turning now to a more detailed description of aspects of the present invention, FIGS. 1-4 depict a portion of an IC wafer 100A after fabrication operations for forming a robust (i.e., low corrosion rate; low etch selectivity to the KWE composition) protective gate cap 160A (shown in FIGS. 3 and 4) in accordance with aspects of the invention. More specifically FIG. 1 depicts a cross-sectional view (on the X-Y axis) of the IC wafer 100A after fabrication operations according to embodiments of the invention. As shown in FIG. 1, known fabrication operations have been used to form the IC wafer 100A. A variety of fabrication operations are suitable for fabricating the IC wafer 100A to the stage shown in FIG. 1. Because the fabrication operations are well-known, they have been omitted in the interest of brevity. In embodiments of the invention, the IC wafer 100A includes a substrate 102 having FEOL devices (e.g., transistors, capacitors, resistors, etc.) formed therein. A metal gate structure having a gate metal region 114 and a gate work function metal (WFM) 112 if formed over the substrate 102 and communicatively coupled to the active regions of the FEOL devices formed in the substrate 102. Gate spacers 110 have been formed on sidewalls of the metal gate region 114 and the gate WFM region 112. Known fabrication operations have been used to recess the metal gate region 114 (e.g., by about 40 nm) to form a SAC trench 120.

FIG. 2 depicts a cross-sectional view of the IC wafer 100A after additional fabrication operations according to embodiments of the invention. As shown in FIG. 2, known fabrication operations (e.g., ALD) have been used to conformally deposit a layer of amorphous silicon (a-Si) 170 over the IC wafer 100A such that the layer 170 extends into the SAC trench 170 and over top surfaces of the metal gate regions 114.

FIG. 3 depicts a cross-sectional view of the IC wafer 100A after additional fabrication operations according to embodiments of the invention. As shown in FIG. 3, a silicidation anneal operation has been applied (e.g., temperature range of about 700 C to about 900 C and exposure times of about 5 seconds to about 60 seconds) such that, at the interface between the a-Si layer 170 and the top surface of the metal gate region 114, a protective cap region 160A is formed as a silicide of the metal gate region 114 and the a-Si layer 170. In accordance with aspects of the invention, the metal gate region can be tungsten (W), and the silicide can be a silicide of W.

FIG. 4 depicts a cross-sectional view of the IC wafer 100A after additional fabrication operations according to embodiments of the invention. As shown in FIG. 4, the portion of the a-Si layer 170 (shown in FIG. 3) that did not react with the metal gate 114 has been removed using known methods for removing a-Si selective to a tungsten silicide material.

FIGS. 5-6 depict a portion of an IC wafer 100B after fabrication operations for forming a robust (i.e., low corrosion rate; low etch selectivity to the KWE composition) protective gate cap 160B (shown in FIG. 6) in accordance with aspects of the invention. More specifically, the IC wafer 100B and its associated fabrication operations shown in FIG. 5 are substantially identical to the IC wafer 100A and associated fabrication operations shown in FIG. 1.

FIG. 6 depicts a cross-sectional view of the IC wafer 100B after fabrication operations according to embodiments of the invention. As shown in FIG. 5, known fabrication operations have been used to form a robust cap region 160B over a top surface of the gate metal region 114. In embodiments of the invention, the robust cap region 160B is a nitride of the gate metal region 114 (e.g., W) and can be formed using a plasma nitration process. In general, nitriding is a heat treating process that diffuses nitrogen into the surface of a metal to create a case-hardened surface. Plasma nitriding is a hardening treatment for metallic materials. In plasma nitriding, the reactivity of the nitriding media is not due to the temperature but to the gas ionized state.

Figure 7:
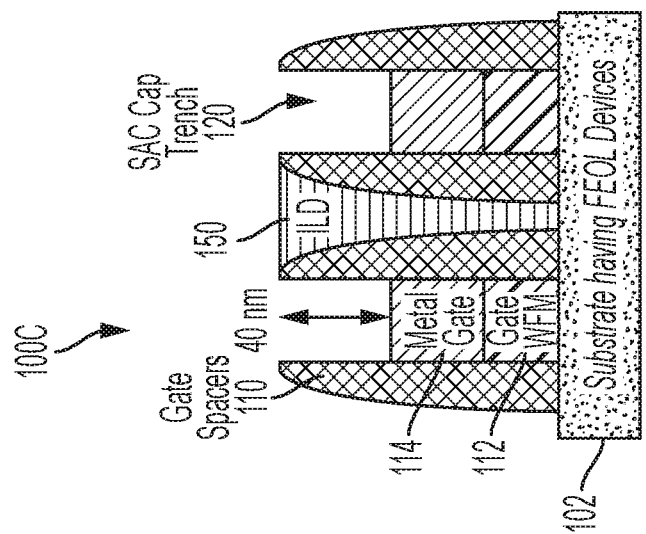

FIGS. 7-8 depict a portion of an IC wafer 100C after fabrication operations for forming a robust (i.e., low corrosion rate; low etch selectivity to the KWE composition) protective gate cap 160C (shown in FIG. 8) in accordance with aspects of the invention. More specifically, the IC wafer 100C and its associated fabrication operations shown in FIG. 7 are substantially identical to the IC wafer 100C and associated fabrication operations shown in FIG. 1.

FIG. 8 depicts a cross-sectional view of the IC wafer 100C after fabrication operations according to embodiments of the invention. As shown in FIG. 8, known fabrication operations have been used to form a robust cap region 160C over a top surface of the gate metal region 114. In embodiments of the invention, the robust cap region 160B is a carbon enriched region of the gate metal region 114 (e.g., W) and can be formed using any suitable carbon implant process.

Figure 9:
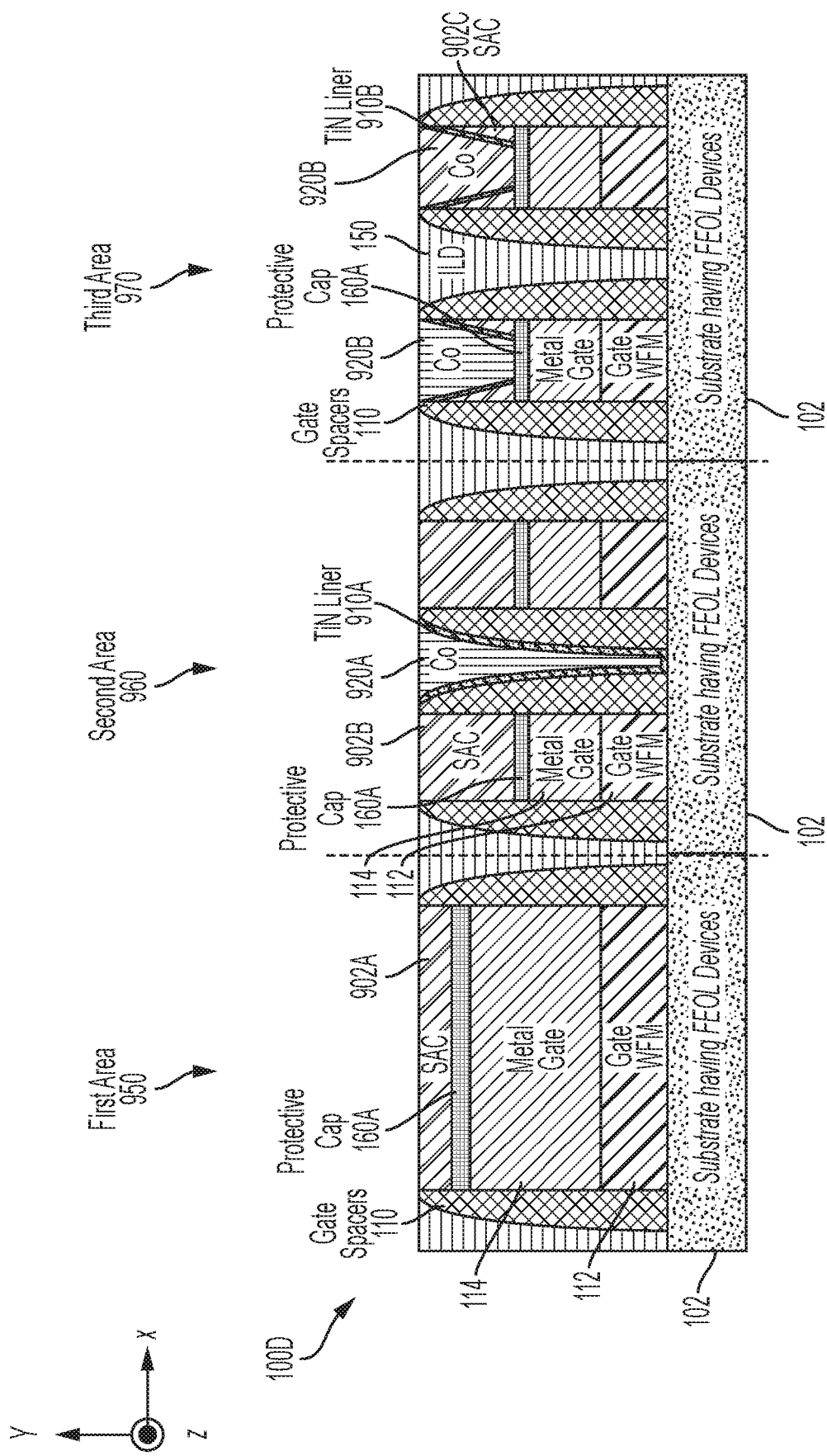
FIG. 9 depicts a cross-sectional view of representative sections of an IC after forming proactive caps in accordance with aspects of the invention, and after additional gate metallization operations.

FIG. 9 depicts a portion of an IC wafer 100D having a first area 950, a second area 960, and a third area 970. In each of the areas 950, 960, 970, the protective cap region 160A has been integrated into example configurations of interlayer dielectric (ILD) regions 150, gate structures 114, 112, contact liners 910A, 910B, and S/D contacts 920A, and gate contacts 920B. The ILD region 150, contact liners 910A, 910B, S/D contacts 920A, and gate contacts 920B can be formed in any suitable manner as previously described herein. The protective cap regions 160A can be formed in accordance with the fabrication operations shown in FIGS. 1-4. In embodiments of the invention, the protective cap regions 160A can instead be the protective cap regions 160B (shown in FIG. 6) or the protective cap regions 160C (shown in FIG. 8). In accordance with aspects of the invention, a SAC structure 902A is formed over the protective cap region 160A in the first area 950, a SAC structure 902B is formed over the protective cap region 160A in the second area 960, and a SAC structure 902C is formed over the protective cap region 160A in the third area 970. In the third area 970, the gate contacts 920B are formed through the SAC regions 902C to contact the protective gap regions 106A.

In accordance with aspects of the invention, the protective cap regions 106A, 106B, 106C are formed from cap region materials that will not have etch selectivity to the KWE composition that etches the contact liners 910A, 910B (e.g., TiN) selective to the S/D contacts 920A (e.g., Co) and the gate contacts 920B (e.g., Co). In embodiments of the invention, a characteristic of the gate material 114, 112 that makes it susceptible to the above-described TiN wet etch composition is the gate material's corrosion rate. Accordingly, in embodiments of the invention, the protective cap regions 160A, 160B, 160C can be formed from cap region materials in the manners depicted in FIGS. 1-4, 5-6, and 7-8 having a wet etch rate that is <about 5 A/min in response to the KWE composition. In embodiments of the invention, the protective cap regions 106A, 106B, 106C can be formed from cap region materials each having a wet etch rate in response to the KWE composition that is <about 1% of the wet etch rate of the gate materials 114, 112. In each of the previously-described protective cap region fabrication processes, the resulting protective cap region material 160A, 160B, 160C is the gate material having impurities (e.g., silicide, nitride, carbon, and the like) that reduce the gate material's etch rate in response to the KWE composition in that region (i.e., the protective cap regions 160A, 160B, 160C), thereby rendering the protective gate cap regions 160A, 160B, 160C robust in that the protective gate cap region 160A, 160B, 160C will not have etch selectivity to the KWE composition that etches the contact liners 910A, 920B (e.g., TiN) selective to the S/D contacts 920A (e.g., Co) and the gate contacts 920B (e.g., Co).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming an integrated circuit, the method comprising:
    forming an active semiconductor device region over a substrate;
    forming a first contact structure over the active semiconductor device region, the first contact structure comprising a first contact liner material and a first contact body material;
    forming a conductive gate structure over the active semiconductor device region; and
    forming a first gate cap on the conductive gate structure, the first gate cap comprising a first gate cap material;
    wherein the first contact liner material comprises a first etch selectivity responsive to a first etch composition;
    wherein the first contact body material comprises a second etch selectivity responsive to the first etch composition;
    wherein the first gate cap material comprises a third etch selectivity responsive to the first etch composition;
    wherein the first etch selectivity is greater than the second etch selectivity; and
    wherein the first etch selectivity is greater than the third etch selectivity.

2. The method of claim 1 further comprising forming a second gate cap on the first gate cap.

3. The method of claim 1, wherein:
the conductive gate structure comprises a conductive gate body having a conductive gate body etch selectivity responsive to the first etch composition; and
the conductive gate body etch selectivity is greater than the third etch rate selectivity.

4. A method of forming an integrated circuit, the method comprising:
forming an active semiconductor device region over a substrate;
forming a first contact structure over the active semiconductor device region, the first contact structure comprising a first contact liner material and a first contact body material;
forming a conductive gate structure over the active semiconductor device region; and
forming a first gate cap on the conductive gate structure, the first gate cap comprising a first gate cap material;
wherein forming the first gate cap comprises converting a region of the conductive gate structure to the first gate cap material;
wherein the first contact liner material comprises a first etch selectivity responsive to a first etch composition;
wherein the first contact body material comprises a second etch selectivity responsive to the first etch composition;
wherein the first gate cap material comprises a third etch selectivity responsive to the first etch composition;
wherein the first etch selectivity is greater than the second etch selectivity; and
wherein the first etch selectivity is greater than the third etch selectivity.

5. The method of claim 4, wherein:
the conductive gate structure comprises a conductive gate body comprising a conductive gate body material; and
the first gate cap material comprises a silicide of the conductive gate body material.

6. The method of claim 5, wherein forming the first gate cap comprises:
depositing a first layer of material on a top surface of the conductive gate body; and
annealing the first layer of material and the conductive gate body to convert a region of the conductive gate body material to the silicide of the conductive gate body material.

7. The method of claim 6, wherein:
the first layer of material comprises amorphous silicon; and
the conductive gate body comprises tungsten.

8. The method of claim 4, wherein the first gate cap material comprises a nitride.

9. The method of claim 8, wherein forming the first gate cap material comprises applying a plasma nitridation process to the region of the conductive gate structure.

10. The method of claim 4, wherein:
the first gate cap material is comprises carbon; and
forming the first gate cap material comprises implanting carbon into to the region of the conductive gate structure.

11. The method of claim 4, wherein:
the first contact liner material comprises TiN;
the first contact body material comprises Co;
the conductive gate structure comprises tungsten (W); and
the first gate cap material is selected from the group consisting of a silicide of W, a nitride of W, and W implanted with carbon.

* * * * *